United States Patent [19] [11] 4,391,038
Greene et al. [45] Jul. 5, 1983

[54] METHODS AND APPARATUS FOR PREPARING THE TERMINATED END OF FLAT CABLE FOR CONNECTORIZATION

[75] Inventors: Richard A. Greene, Pickerington; Robert P. Kennedy, Columbus, both of Ohio

[73] Assignee: Western Electric Company, Inc., New York, N.Y.

[21] Appl. No.: 336,981

[22] Filed: Jan. 4, 1982

[51] Int. Cl.³ .................. H05K 3/00; B23P 23/00
[52] U.S. Cl. .................. 29/829; 29/564.1; 29/844; 140/105; 156/344; 156/584; 156/204
[58] Field of Search .................. 29/829, 830, 844, 745, 29/749, 564, 564.1; 221/73; 140/105; 156/209, 216, 344, 443, 459, 584

[56] References Cited
U.S. PATENT DOCUMENTS

| 3,888,613 | 6/1975 | Fries et al. | 156/216 X |
| 4,173,507 | 11/1979 | Tobey | 156/443 |
| 4,173,510 | 11/1979 | Tobey | 156/584 |
| 4,177,104 | 12/1979 | Parker | 156/584 |
| 4,216,048 | 8/1980 | Gehweiler | 156/344 |
| 4,302,065 | 11/1981 | Taylor | 339/17 F |
| 4,310,365 | 1/1982 | Elliott et al. | 156/55 |
| 4,367,585 | 1/1983 | Elliott et al. | 29/825 X |

Primary Examiner—Francis S. Husar
Assistant Examiner—Carl J. Arbes
Attorney, Agent, or Firm—K. R. Bergum; R. P. Miller

[57] ABSTRACT

An apparatus (10) and methods are disclosed for preparing the terminated end of a flat cable (25) for connectorization wherein the cable is of the type having two arrays of overlying/underlying conductors (27, 28) separated by an insulative center film (31), with each array being bonded directly to only the respectively adjacent one of two mutually disposed outer insulative films (33, 34), and wherein an aligned pair of isolating members (36, 37) are respectively positioned between, and transversely of, a different side of the center film the associated array of conductors at each predetermined terminating end of the cable, as fabricated. The apparatus includes a cross-slide assembly (12, 41), a flare-out die mechanism (14, 97), an optional trimming die mechanism (16, 134, 136) and a fold-back roller mechanism (18, 151, 167, 168). Such a composite apparatus sequentially performs the following operation on the terminated end of the described type of flat cable: (1) sequentially flare-out (separate and bend) terminated end sections (33a, 34a) of the outer cable films, together with the respective coextensive arrays of conductor end portions (27a, 28a) bonded thereto, preferably approximately 90 degrees from the normal plane of the mutually contacting one of the two leading isolating members (36 or 37); (2) trim each such bent cable end section to a predetermined length, and (3) sharply fold-back each such trimmed end section against the remaining adjacent portion of the cable so as to then fully expose the previously inner major sides of the conductor end portions (27a, 28a) in each array for subsequent connectorization.

26 Claims, 13 Drawing Figures

METHODS AND APPARATUS FOR PREPARING THE TERMINATED END OF FLAT CABLE FOR CONNECTORIZATION

BACKGROUND OF THE INVENTION

1. Field of the Invention

This invention relates to the connectorization of flat cable and, more particularly, to methods and apparatus for exposing the conductor ends of one particular type of cable in a manner that facilitates the connectorization thereof to connectors of either the solder or solderless type.

2. Background of the Invention

In one particular type of flat cable designed for telephone under-carpet cable applications, known as TUCC* flat cable (*registered trademark of the Western Electric Company), two precisely offset arrays of conductors are separated by an insulative center film, with each array being bonded directly to only the respectively adjacent one of two mutually disposed insulative outer films. The conductors are preferably of rectangular or ribbon configuration in such a cable so as to allow the latter to be fabricated with minimum thickness. This becomes of paramount importance from both a safety and an esthetic standpoint when a given length of such cable must be folded back upon itself to allow a change in direction for a particular under-carpet wiring application.

Prior to laminating the conductors between the center and outer films, a spaced array of resilient insulative isolating members, such as in the form of adhesive-backed plastic tapes, are transversely positioned on each side of the center film. Corresponding tapes in the two opposite side arrays are aligned in pairs at respective predetermined terminating sites along the cable, as fabricated, such as at intervals of 5, 10 or 15 feet.

One preferred form of such a uniquely constructed multi-arrayed cable is disclosed in U.S. Pat. No. 4,310,365 of W. A. Elliott-T. J. Taylor, assigned to the same assignee as the present invention. An apparatus for effecting the securement of the above-described isolating tapes in precisely aligned opposite side pairs along the center film of the cable in queston is disclosed in another co-pending application of M. P. Asar-R. A. Greene, Ser. No. 210, 703, filed Nov. 26, 1980, also assigned to the same assignee as the present invention.

When the described isolating tapes are also of a material that will not adhere to the adhesive-coated side of the particular outer film in contact therewith, it is seen that the outer film, together with the coextensive array of conductor end portions bonded only thereto, may advantageously be readily separated from the center film at each predetermined cable termination site. This, of course, in and of itself greatly facilitates the subsequent connectorization of the cable.

In this regard, one preferred method employed heretofore to effect the connectorization of the particular type of cable of concern herein is disclosed in U.S. Pat. No. 4,302,065, of T. J. Taylor, also assigned to the same assignee as the present invention. As disclosed in this latter referenced application, a terminated end section of each outer film, together with the coextensive array of conductor end portions bonded thereto, is initially separated outwardly at a substantial angle from the initially contacting one of the leading pair of isolating tapes, such as by means of a manually manipulated knife blade, or any other similarly operated instrumentality. Thereafter, each outwardly displaced outer film, together with the associated array of coextensive conductor end portions bonded thereto, is sharply folded back upon itself, such as by means of a manual operation. This advantageously results in one major surface of each of the folded-back conductor end portions in each array advantageously being fully exposed (with no conventional outer film stripping operation being required) so as to facilitate the subsequent connectorization of the cable to a conventional connector of either the solder or solderless type.

What has been urgently needed heretofore in preparing each terminated end of the above-described type of flat cable for connectorization is a reliable, rapid and simplified method, and automated device for its practice, to carry out the necessary flare-out, trimming and fold-back operations performed thereon. The need for such a method and automated apparatus is of particular importance because of the fact that the subject cable, as previously noted, is normally cut to relatively short predetermined lengths (e.g., of 5, 10 or 15 feet) and connectorized before being shipped to the field for universal use in customer installations.

SUMMARY OF THE INVENTION

In accordance with the principles of the present invention, one preferred method of preparing the terminated end of a flat cable of the type in question is carried out with an illustrative apparatus embodiment that includes a cross-slide assembly, a flare-out die mechanism, an optional trimming die mechanism and a fold-back roller mechanism. Such a composite apparatus sequentially performs the following operations on the terminated end of the previously described type of flat cable: (1) sequentially flare out (separate and bend) terminated end sections of the outer cable films, together with the respective coextensive arrays of conductor end portions bonded thereto, preferably approximately 90 degrees from the normal plane of the initially contacting one of the two leading isolating tapes; (2) optionally trim each such bent cable end section to a predetermined length, and (3) sharply fold back each such trimmed end section against the remaining adjacent portion of the cable so as to then fully expose the previously inner major sides of the conductor end portions in each array for subsequent connectorization.

As the sequential operations described above are completely automated, they may not only be performed much more rapidly and accurately than when manually operated instrumentalities are employed, but result in the folded back cable sections, in particular, having considerably improved uniformity with respect to length, alignment and flatness.

DETAILED DESCRIPTION OF THE INVENTION

It should be understood that while the invention is described in detail herein relative to preparing the terminated end of one particular type of flat cable for connectorization, the apparatus also may have utility in separating the terminated ends of diverse types of adjacent, but separable, material layers, having different degrees of inherent resiliency or flexure, from one another in not only similar but other types of composite strip stock laminates.

Figures 1, 4, 5:
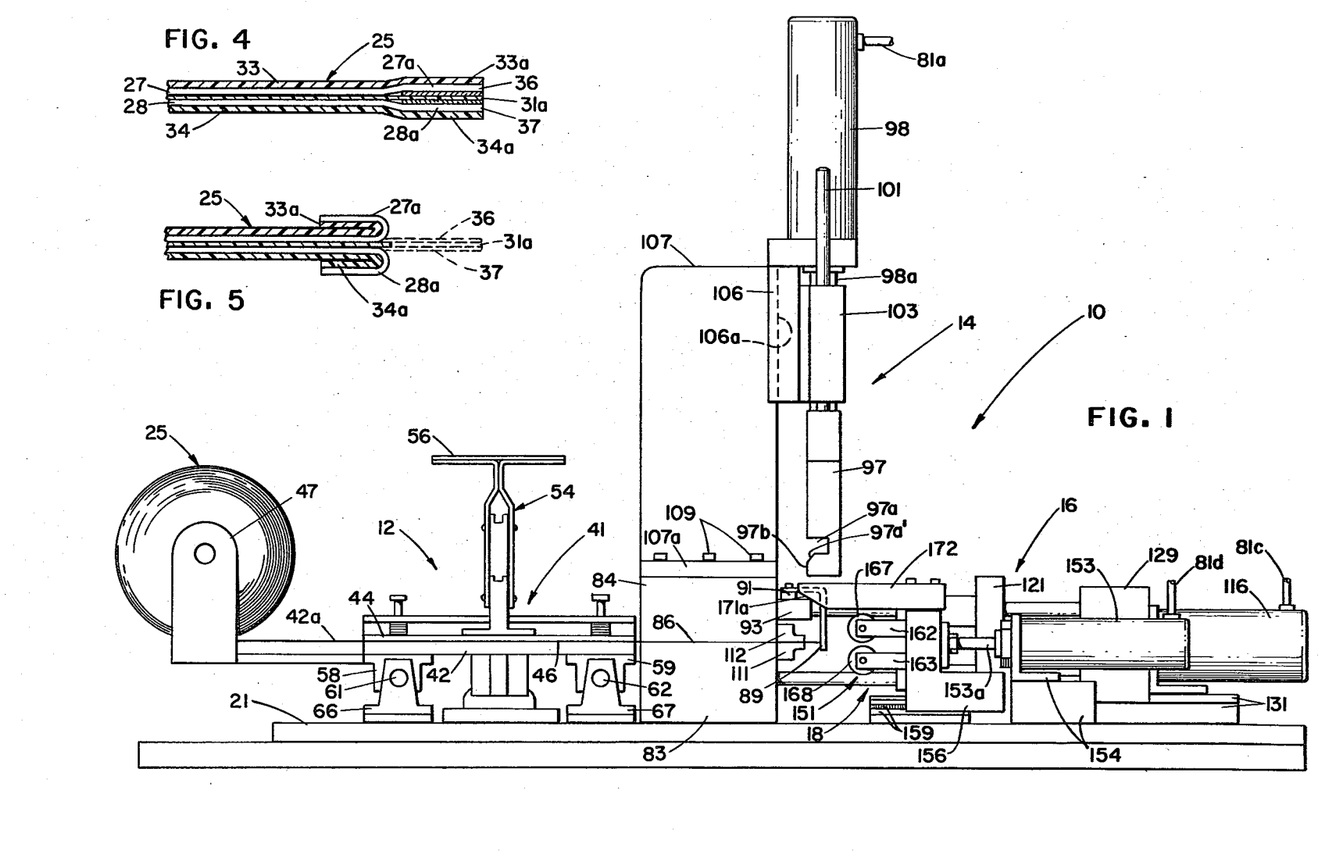
FIG. 1 is a side elevational view of an apparatus embodying the principles of the present invention for flaring out, trimming and folding back two overlying-/underlying arrays of conductor end portions in one particular type of terminated flat cable adapted for undercarpet wiring applications.
FIG. 4 is a fragmentary sectional side view of an end portion of one particular type of flat cable on which the apparatus of FIG. 1 is adapted to perform a conductor-exposing fold-back operation.
FIG. 5 is a fragmentary sectional side view of a terminated end of the cable of FIG. 4, after the apparatus of FIG. 1 has performed a series of unique work functions thereon which result in the folded-back, conductor-exposed end portions in accordance with the principles of the present invention.
Figures 2, 3:
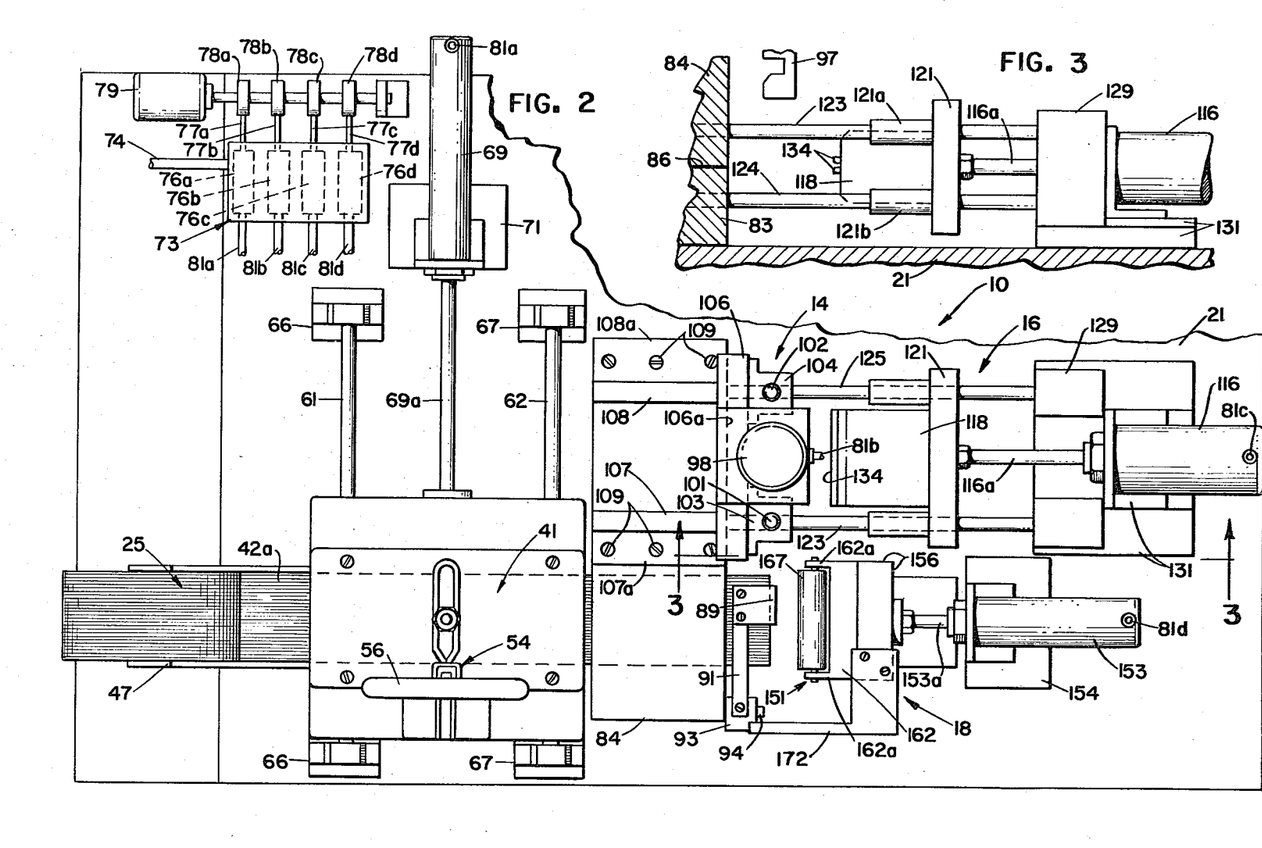
FIG. 2 is a plan view of the apparatus of FIG. 1.
FIG. 3 is an enlarged, fragmentary detail view, taken along the line 3—3 of FIG. 2, illustrating in greater detail how the trimming die assembly is reciprocally mounted in the composite apparatus of FIGS. 1 and 2.

With particular reference first to FIGS. 1 and 2, there is shown a composite flat cable apparatus 10 particularly adapted for preparing the terminated end of a flat cable of the aforementioned type for connectorization. To that end, the apparatus includes a cross-slide assembly 12, a flare-out die mechanism 14, a trimming die mechanism 16 and a fold-back roller mechanism 18, all mounted on a support plate 21 which, in turn, is secured to a suitable bed 23.

Before describing both the structure and function of the various interrelated parts of the composite apparatus 10 in further detail, it will be recalled that the apparatus as embodied herein is particularly adapted to perform a series of work functions on the terminated end of a flat cable 25 of the type depicted in fragmentary form in FIG. 4, and which is described in detail in the aforementioned co-pending application of W. A. Elliott et al. As disclosed in FIG. 4, it is seen that two precisely offset arrays of conductors 27, 28, preferably of rectangular configuration, are separated by an insulative center film 31, with each array being bonded directly to only the respectively adjacent one of two mutually disposed insulative outer films 33, 34.

As previously noted, prior to laminating the conductors 27, 28 between the center and outer films, a separate narrow insulative member 36 or 37, such as in the form of a plastic tape, is positioned transversely across, and preferably at least lightly secured to, each side of the center film 31 at each of a spaced array of predetermined terminating sites along the cable, as fabricated, such as at intervals on the order of 5, 10 or 15 feet. In accordance with one preferred construction of the cable 25, the isolating tapes 36, 37 are formed with an adhesive backing on the sides thereof in contact with the center film, but with the material of the tapes themselves being of a type that does not result in the opposite sides thereof adhering to either the adjacent conductors 27 of 28) or to the particular inner adhesive-coated side or the adjacent outer film 33 or 34. As such, each leading isolating tape 36 or 37 advantageously allows the contacting end section 33a or 34a of a given outer film, together with the coextensive array of conductor end portions 27a or 28a bonded thereto, to not only be readily separated from the center film 31, but be sharply folded back on themselves (see FIG. 5). As also noted hereinabove, this advantageously completely exposes the previous inner major sides of the conductor end portions in a direct and simplified manner so as to facilitate the subsequent solder or solderless connectorization thereof.

As will now be described in detail, the apparatus 10 performs a series of necessary work functions on the terminated end of the flat cable 25 so as to form the two oppositely directed folded-back end sections, as depicted in FIG. 5, in a reliable, simplified and automated manner.

With particular reference again to FIGS. 1 and 2, the aforementioned cross-slide assembly 12 of the composite apparatus 10 includes a reciprocally mounted cross-slide 41. The latter is comprised of a lower support plate 42 and an upper vertically displaceable spring-biased pressure plate 44 that together define a horizontal flat cable channel 46 therebetween. The channel 46 is dimensioned to receive an end portion of a supply of the flat cable 25, confined within a suitable roll-stock holder 47 which, in turn, is supported on a U-shaped platform 42a that may either be secured to, or comprise an integral part of, the lower cross-slide support plate 42. A spring-biased clamping mechanism 54, operated manually by means of a conventional lever-type handle 56, effects the clamping of an inserted end section of the cable 25 firmly between the lower support plate 42 and the upper spring-biased pressure plate 44.

The support plate 42 of the cross-slide is mounted by means of two pairs of brackets 58, 59 (only one of each pair seen in FIG. 1) on respective ones of a pair of parallel extending guide rods 61 and 62, oriented in the Z direction as viewed in FIGS. 1 and 2. Opposite ends of the guide rod 61 are mounted within aligned bores of a spaced pair of pedestals 66, with opposite ends of the guide rod 62 being similarly mounted in aligned bores of a pair of pedestals 67.

Horizontal (lateral) displacement of the cross-slide 41 in the Z direction may be effected by any suitable drive source, the type embodied herein being an actuable pneumatic air cylinder 69 (seen only in FIG. 2). The housing of the air cylinder is secured to a composite L-shaped bracket 71, the latter being mounted on the main support plate 21. The free end of a piston 69a of the pneumatic cylinder is connected to a facing side of the lower cross-slide support plate 42.

The pneumatic cylinder 69, as well as those described hereinafter which are similarly employed as drive sources in the composite apparatus, may be sequentially controlled in any desired conventional manner. As illustrated, compressed air is sequentially applied to the air cylinder 69, for example, from an air control module 73, shown only schematically in FIG. 2. More specifically, compressed air is supplied to the module from a suitable source (not shown) over an inlet line 74, and then distributed equally to each of four air valves 76a–d, such as of the spring-return, three-way type.

As illustrated, the air valve 76a, for example, has a spring-biased piston 77a that is displaced to actuate the valve in response to an associated cam 78a that is rotatably driven by a suitable drive source, such as a motor 79. Compressed air is thus supplied from an output port of the valve 76a to the pneumatic cylinder 69 at the prooper sequentially controlled times during each operating cycle over an air line 81a, shown only in detached schematic form in the interest of clarity.

It is understood, of course, that each of the other air valves 76b–d, and respectively associated cams 78b–d, employed to operate the three other pneumatic cylinders described in greater detail hereinbelow in the same manner. Concomitantly, while all of the pneumatic cylinders employed in the composite apparatus 10 are shown to be of the spring-return type, it is obvious that they may also be of the pneumatically operated two-way type, if desired. In this regard, it should further be appreciated that other instrumentalities, such as motor-driven lead screws or rack and pinion assemblies, for example, could also be used as drive sources.

Immediatelly adjacent the right side of the cross-slide 41, as viewed in FIGS. 1 and 2, are a pair of upper and lower flat cable guide blocks 83 and 84, respectively, which define a horizontal channel 86 (shown only schematically) that is co-linear with, and forms an extension of, the channel 46 formed in the cross-slide 41. The guide blocks 83 and 84 are permanently secured together by suitable fasteners (or by other means) not shown, with the lower guide block 83, in turn, being fixedly secured to the main support plate 21 in any suitable manner.

In a typical terminated cable forming application, an end section of a discrete length of the cable 25, as confined in roll-stock form on the holder 47, is first manually advanced through the channel 46 of the cross-slide assembly 41, while at a first work station position, as depicted in FIG. 1, and then through the aligned channel 86 defined between the guide blocks 83 and 84 until the end of the cable abuts a stop member 89. The latter member is secured to one end region of a laterally disposed support arm 91. The opposite end region of the arm 91 is pivotally secured to a block 93 that is, in turn, rotatably mounted on a stub shaft 94 secured within a bore of the lower guide block 83. As will be described in greater detail hereinafter, the arm 91 is pivoted so as to displace the stop member 89 out of engagement with the terminated end of the cable 25 during the final foldback operation performed thereon.

With a terminated end of the cable properly positioned within the apparatus 10, the handle 56 of the cross-slide clamping member 54 is pivoted horizontally, with that portion of the cable then confined within the channel 46 thus being clamped between the lower support plate 42 and the upper pressure plate 44. Thereafter, the pneumatic air cylinder 69 is actuated such that the piston 69a thereof is retracted sufficiently to move the cross-slide 41 along the guide rods 61, 62 until positioned at a second work station, which is in direct alignment with the aforementioned flare-out die mechanism 14, best seen in FIGS. 1 and 6–9.

The latter mechanism includes an elongated flare-out die member 97 (seen only in FIGS. 1 and 6A–E) which is of substantially rectangular cross-section, and has a width (in the Z direction in FIG. 1) at least equal to the width of a flat cable 25. The die member 97 is vertically mounted and retractably driven by a pneumatic cylinder 98, the piston 98a of which is secured to the upper end of the die member 97 at the mid-point thereof. Also secured to the upper end of the die member are the lower ends of a pair of guide rods 101 and 102, which are mutually disposed on opposite sides of the pneumatic cylinder piston 98a. Each guide rod is retractably guided within an aligned bore (preferably including a bushing) formed in an associated one of a pair of guide blocks 103 and 104. The guide blocks, as well as the housing of the pneumatic cylinder 98, are mounted on an inverted L-shaped bracket 106 which, in turn, is secured to a pair of upright support plates 107 and 108 (only one seen in FIG. 1). The lower ends of the latter plates have integral (or otherwise secured) short horizontal leg portions 107a or 108a that are secured by suitable fasteners 109 (or by any other means) to the upper cable guide block 84.

As previously mentioned, the pneumatic cylinder 98 may be of the same type as the pneumatic cylinder 69 previously described. In any event, the pneumatic cylinder 98 is preferably operated through the afore-mentioned air control module 73 and, specifically, under the cam-controlled operation of the air valve 81b, coupled to the air cylinder through the previously identified air line 81b.

In accordance with an aspect of the present invention, a lower end region of the flare-out die member 97 is formed with a pecularily shaped recessed notch 97a. The latter is formed with three side walls arranged essentially as three sides of a rectangle, with the lowermost sidewall 97a' merging into a beveled outer surface 97a". The latter surface merges into a flat, vertically oriented face portion 97b which, in turn, through a lower relatively sharply rounded corner of predetermined radius merges into a flat base surface 97c. It is the notch 97a, in cooperation with two protruding nose members 111 and 112, respectively forming outward extensions of the guide blocks 83 and 84, that sequentially effect a 90 degree bend in each of the cable end sections that are ultimately folded back on themselves, as depicted in FIG. 5.

The manner in which such a unique cable forming operation is carried out is best seen with particular reference to FIGS. 6A–E. With an exposed terminated end of the cable 25 initially positioned as in FIG. 6A, it is seen that during the downstroke of the die member 97 to the position depicted in FIG. 6B, the lower base surface 97c thereof initially contacts and commences the bending of the exposed end of the cable downwardly until the beveled surface 97a" and the front face portion 97b, in succession, wipe across and effect the sharp downward deflection of the outer film end section 33a. This ultimately causes the entire exposed end of the cable 25 to be sharply bent 90 degrees downwardly, with a portion of the outer film end section 34a being firmly biased against a forward face portion 111a of the lower nose member 111 (the latter either being secured to or forming an integral part of the lower cable guide block 83). It should be understood that in FIGS. 6A and B, the leading pair of isolating tapes 36 and 37 are not separately shown in the cable 25 in the interest of clarity.

Figure 6A:
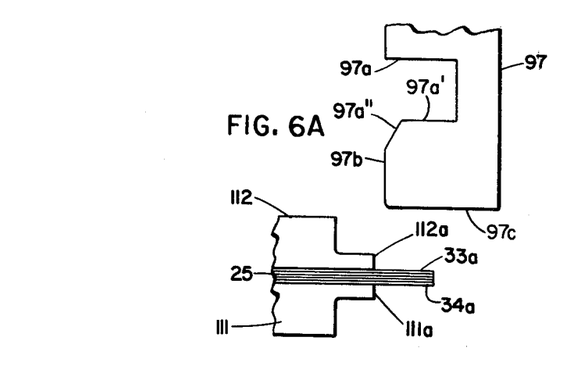
FIG. 6, consisting of five related fragmentary side elevational views, partially in section, designated 6A to 6E, illustrates in greater detail the manner in which the reciprocally operated flare-out die member, in cooperation with stationary guide block-supported nose members, sequentially effect the separation and bending of an end section of each outer film, together with the array of conductor end portions bonded thereto, 90 degrees from a center film and a pair of isolating members secured to the latter, in a flat cable of the type depicted in FIG. 4.
Figure 6B:
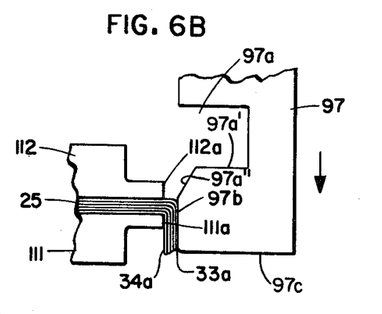
Figure 6C:
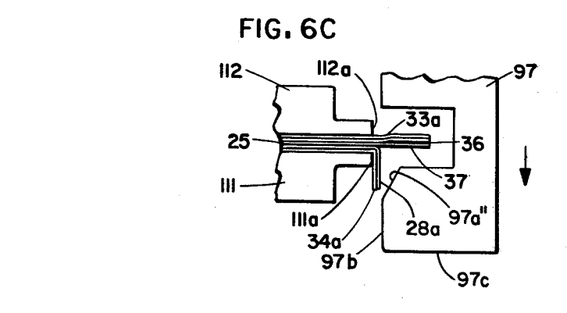

Upon further downward movement of the die member 97 to the position depicted in FIG. 6C, the pecularily shaped notch 97a formed therein allows the then bent-down end portion of the center film 31a, and at least the coextensive isolating tapes 36 and 37 of the cable 25 to snap back to an approximately horizontal position, as a result of their inherent resiliency. This, in turn, forces the initially bent-down, and more easily flexed, upper outer film end section 33a, together with the coextensive array of conductor end portions 27a bonded thereto, to likewise return to a substantially horizontal position.

Figure 6D:
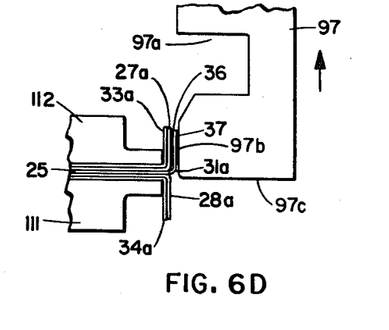

In response to the retraction of the pneumatic cylinder piston 98a, the lower surface of the die member notch 97a' initially, followed in succession by the beveled surface 97a", and the front face portion 97b, wipe across the then protruding lower isolating tape 37, the last-mentioned wiping action being depicted in FIG. 6D. This ultimately causes the coextensive end portion of the center film 31a, the upper isolating tape 36 and the upper outer film end section 33a, together with the coextensive array of conductor end portions 27a bonded to the latter, to be sharply bent 90 degrees upwardly against a forward face portion 112a of the upper guide block-associated nose member 112.

Figure 6E:
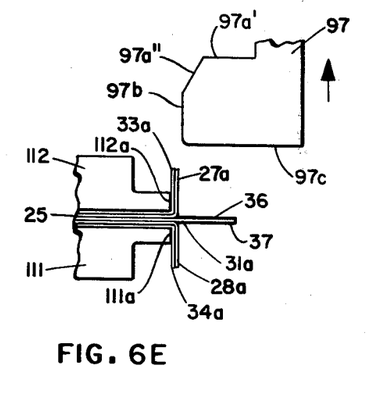

Upon further upward movement of the die member 97 to the position depicted in FIG. 6E, the pecularily shaped notch 97a formed therein again allows the then vertically upward bent portions of the center film 31a and isolating tapes 36 and 37 to snap back to an approximately horizontal position, as a result of their inherent resiliency. In this regard, should it be desired in a given cable to more effectively utilize any inherent resiliency of the isolating tapes in addition to (or in place of) the center film 31 in effecting the snap-back action desired, the length of the exposed end of the cable to be flared out could be readily chosen such that the point at which the conductors are bent outwardly occurs appreciably forward of a laterally disposed, rearward portion of each isolating strip that remains sandwiched in the cable.

It should be appreciated that the actual interior configuration of the notch 97a in the flare-out die member 97 may also take a number of other forms and still function with equal effectiveness. In this regard, the most important requirements are that the notch have sufficient depth, and vertical height, so as to cooperate with the beveled face portion 97a" in allowing the snapback of any terminated end section(s) of a given cable (or of any other type of composite laminate) not intended to be permanently bent or flared out.

After the outer film end sections 33a and 34a, together with their respectively associated conductor end portions 27a and 28a have been separately bent 90 degrees in opposite directions, as depicted in FIG. 6E, such flared-out ends are preferably trimmed to the desired length by the aforementioned trimming die mechanism 16. This mechanism includes a pneumatic air cylinder 116 which may be identical to the previously described air cylinders 69 and 98, and is controllably operated by the aforementioned cam-controlled air valve 76c coupled thereto by the air line 81c. The air cylinder piston 116a is coupled to a trimming die member 118, best seen in FIGS. 3, 7 and 8.

The die member 118 is mounted on a support block 121 which, in turn, through upper and lower pairs of sleeves 121a and b, is mounted on, and retractably guided along, upper and lower pairs of guide rods 123 and 124 arranged in space quadrature, as seen only selectively in FIGS. 2 and 3. The upper guide rods 123 are secured at one of their common ends within respective bores of the upper cable guide block 84, whereas the lower guide rods 124 are secured at the corresponding common ends within respective bores of the lower cable guide block 83. The opposite common ends of all of the guide rods are secured within respectively aligned bores of a support member 129 that forms part of an L-shaped composite bracket 131. The latter bracket also supports the housing of the pneumatic cylinder 116.

Figure 7:
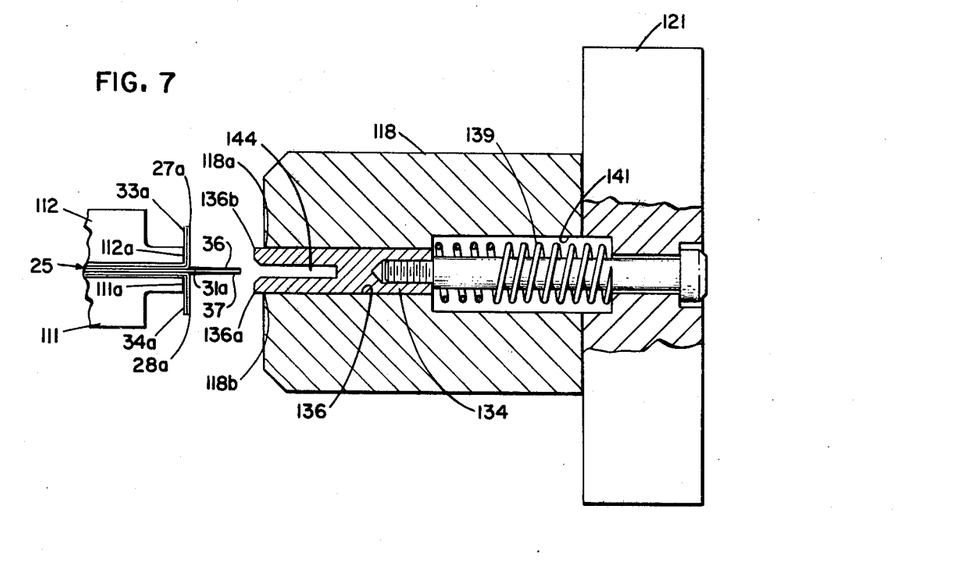
FIGS. 7 and 8 are fragmentary detail views of the main portion of the trimming die mechanism and, in particular, respectively illustrate the different positions of the retractably mounted trimming die member, together with the spring-biased die insert confined therein, immediately before and after a trimming operation has been performed on the previously flared-out end sections of a flat cable of the type depicted in FIG. 4.
Figure 8:
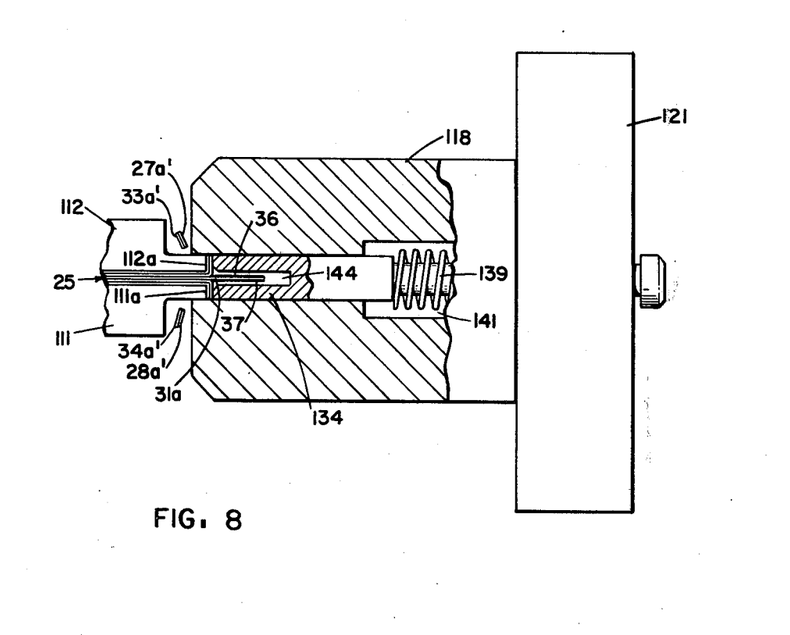
Figure 9:
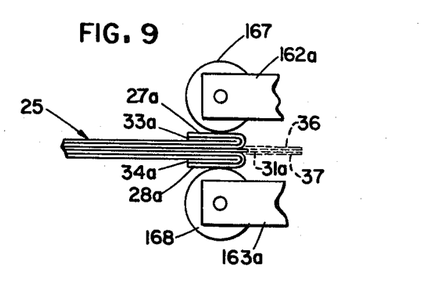
FIG. 9 is a fragmentary side view, partially in section, of a flat cable with folded back end sections similar to that depicted in FIG. 5, but further illustrating how the retractably mounted rollers in the fold back mechanism effect such a formed terminated cable.

With particular reference now to the trimming die member 118, as best seen in FIGS. 7 and 8, it includes a die insert 134 which is retractably mounted in a laterally disposed channel 136. A predetermined, outwardly directed, spring-biased force is normally exerted against the die insert by means of a coil spring 139. The latter is confined within a bore 141 formed in part within the die member 118 and in part within the associated support block 121. The forward end of the die insert 134 has a laterally disposed slot 114 formed therein, with such slot being adapted to receive the forward, exposed end portion 31a of the center film, and the two leading isolating tapes 36, 37 that remain secured thereto, after the cable flare-out or bending operation has been completed.

During the trimming operation, the pneumatic cylinder 116 is operated such that the piston 116a thereof is projected outwardly, causing the trimming die member 118 to be advanced to the left, as viewed in FIG. 7, until the inner, forward and laterally disposed corners 118a and b thereof wipe past the sharp outer corners of the nose members 112 and 111, respectively. This wiping action effects the shearing off of short outer film end section extremities 33a' and 34a', together with the conductor end portion extremities 27a' and 28a' respectively bonded thereto, as depicted in FIG. 8. Also during the trimming operation, the major portions of the vertically bent and oppositely directed cable end sections, of desired predetermined length, are tightly clamped between the forward face portions 11a, 112a of the lower and upper nose members 111, 112, and the respectively aligned face portions 136a, 136b of the spring-biased insert 134.

It should be understood that while the cable trimming operation is normally desired, it may nevertheless be optionally employed in a given terminated cable forming application. This follows from the fact that the primary reason for the trimming operation is that the ultimately folded back and exposed conductor end portions normally need not be as long as the exposed length of terminated cable initially required to effect the prior 90 degree bends therein.

Upon completion of the cable trimming operation, the pneumatic cylinder 116 is operated to effect the retraction of the piston 116a thereof to its original quiescent position, as depicted in FIG. 2. Thereafter, the pneumatic cylinder 69 is again operated to cause the cross-slide 41 to transfer the then flared-out, trimmed and clamped cable 25 from the second work station to the first work station, as defined by the initial position of the cross-slide 41 depicted in FIG. 1.

At that time the aforementioned composite fold-back mechanism 18 is operated. This mechanism includes a fold-back roller assembly 151 which is retractably driven by a pneumatic air cylinder 153. Actuation of the latter is also controlled by the aforementioned air module 73 and, in particular, by the cam-controlled air valve 76d incorporated therein. The latter valve is coupled to the air cylinder 153 over the aforementioned line 81d. The housing of the air cylinder is mounted on a composite L-shaped bracket 154 that is secured to the main support plate 21.

Referring again to the fold-back roller assembly 151, it includes an L-shaped support block 156 that is coupled to the piston 153a of the air cylinder 153, and is slideably mounted on a composite track identified generally by the reference numeral 159 (seen only in FIG. 1). The vertically oriented portion of the L-shaped support block 156 has secured thereto a pair of laterally disposed, and outwardly extending bifurcated support members 162 and 163, each of which includes a laterally spaced pair of support arms 162a and 163a (best seen in FIGS. 2 and 9. A fold-back roller 167 is rotatably mounted on the arms of the support member 162, with a similar roller 168 being rotatably mounted on the arms of the support member 163. The rollers 167 and 168 are spaced apart so as to define a nip therebetween that is sufficient to receive the remaining exposed end portion 31a of the center film 31, and the two leading isolating tapes secured to opposite sides thereof, after the flare-out (bending) and trimming operations have been performed on the terminated end of the cable 25.

The peripheral surfaces of the fold-back rollers 167 and 168 are preferably formed of metal, but could be formed of other materials, such as of relatively hard rubber, if desired. It is also understood that the rollers could be mounted in spring-biased relationship, if desired, but this has not been found necessary for the particular terminated flat cable forming operation of primary concern herein.

It will be recalled that in connection with initially positioning and clamping a terminated end portion of a flat cable 25 within the apparatus 10, it is advanced through the cross-slide channel 46, and channel 86 defined between the guide blocks 83 and 84, until it abuts against the aforementioned downwardly projecting and pivotally mounted cable stop 89, as best seen in FIG. 1. This cable stop, as previously described, is secured to one end region of the laterally disposed arm 91, with the opposite end region of the latter being secured to the block 93 that is rotatably mounted on the upper cable guide block 84.

In order to allow the fold-back rollers 167 and 168 to be advanced into engagement with the 90 degree flared-out end sections of the terminated cable while aligned therewith, the cable stop 89 is pivoted upwardly away from both the cable and the upper roller 167 in the following manner: An L-shaped member 172, secured such as by suitable fasteners to the upper surface of the vertically oriented portion of the retractable L-shaped support block 156, is formed on the underside thereof, at its outer free end, with a beveled cam surface 171a (see FIG. 1). This beveled surface, when advanced into contact with the mating surface of the rotatably mounted block 93, causes the latter to pivot the connected support arm 91, and the cable stop 89 secured to the latter, upwardly as viewed in FIG. 1 out of the path of the upper fold-back roller 167, in particular. Thus, as the rollers 167 and 168 are advanced into contact with the respectively aligned and oppositely directed bent-out cable end sections, the latter are progressively folded back on themselves until acquiring the positions depicted in FIG. 9.

With the fold-back operation having been completed, and upon the rollers 167 and 168 having been retracted by the pneumatic air cylinder 153 back to their original quiescent positions, as depicted in FIGS. 1 and 2, the clamping force exerted by the cross-slide 41 on that section of the cable 25 confined therewithin is removed. This allows the cable, with the completely formed folded-back end sections, to be freely withdrawn from the apparatus preparatory to being secured to a connector in a separate operation which is not of concern herein.

In this regard, however, it should be appreciated that the ultimately exposed outer major surfaces of the cable conductor end portions 27a and 28a may be readily accessed by respectively aligned contacts of a connector (not shown) of either the solder or solderless type, as previously described. It is further simply noted at this point that depending on the type of connector to be used with the cable, it may be desirous in certain applications to first trim back a portion (or all) of the remaining exposed free end 31a of the cable center film, together with any coextensive forward portions of the isolating tapes 36, 37 that remain secured thereto. It is generally preferred, however, to leave at least short portions of such exposed cable elements, as they can provide additional dielectric shielding between two mutually disposed arrays of connector contacts, for example, in regions forward of the folded back sections of the cable.

While a preferred apparatus for preparing the terminated end of a flat cable for connectorization, and methods to that end, have been disclosed herein, it is obvious that various modifications may be made to the present illustrative embodiment and methods of the invention, and that a number of alternative related embodiments and methods could be devised by one skilled in the art without departing from the spirit and scope of the invention.

What is claimed is:

1. A method of forming the terminated end of a flat cable of indefinite length with fold-back portions so as to facilitate the subsequent connectorization thereof, wherein the cable is of the type having two overlying-/underlying arrays of laterally disposed conductors separated by a resilient insulative center film, with each array being secured directly to only the respectively adjacent one of two mutually disposed outer insulative films, and wherein the cable, as fabricated, further includes an aligned pair of insulative isolating members respectively positioned on opposite sides of, and extending transversely across, the center film at each predetermined terminated end of the cable, said isolating members being of a material that will not adhere to the associated array of conductors and outer film, said method including the steps of:

confining at least an end region of the flat cable such that only an end portion thereof of predetermined length is exposed;

applying a first force against the major surface of one outer film end section, in a first direction, to effect a sharp, retainable bend, at a predetermined angle, in both the other outer film end section, and the coextensive array of conductor end portions secured thereto;

releasing the first force from the one outer film end section so as to allow the center film end portion and the opposite side isolating members positioned thereon, to snap back to at least approximately their original positions as a result of the selective inherent resiliency thereof, thereby, also forcing the one outer film end section, and the coextensive array of conductor end portions secured thereto, back to at least approximately their original positions;

applying a second force against the major surface of the then one exposed isolating member previously positioned adjacent the other then bent-out outer film end section, in a second direction, to effect a sharp, retainable bond, at a predetermined angle, in both the one outer film end section, and the array of conductor end portions secured thereto;

releasing the second force from the one exposed isolating member so as to allow the center film end portion and the one and other side isolating members positioned thereon, to snap back to at least approximately their original positions as a result of the selective inherent resiliency thereof, and applying a force against each of said bent-out outer film end sections, on the conductor-secured side thereof, and in a direction to effect the sharp fold-back thereof against the adjacent portion of the associated outer film that remains a part of the fabricated cable and, thereby, position the associated array of conductor end portions in the plane of the cable to facilitate the subsequent connectorization thereof.

2. A method in accordance with claim 1 wherein said first and second forces result in the respective one and other outer film end sections being firmly biased, in sequence, against respectively aligned rigid backing surfaces.

3. A method in accordance with claim 2 wherein each of said outer film end sections, and the associated array of conductor end portions secured thereto, are bent outwardly at an angle of approximately 90 degrees.

4. A method in accordance with claim 1 wherein said first and second forces are applied to said one outer film end section and to said one isolating member in the form of a wiping action produced therealong.

5. A method in accordance with claim 1 wherein said first and second forces result in the respective one and other outer film end sections being firmly biased, in sequence, against respectively aligned rigid backing surfaces, and wherein said first and second forces are applied to said one outer film end section and to said one isolating member in the form of a wiping action produced therealong.

6. A method in accordance with claim 1 further including the step of trimming back each bent-out outer film end section, together with the array of conductor end portions secured thereto, to a predetermined length prior to the fold-back step.

7. A method in accordance with claim 5 further including the step of trimming back each bent-out outer film end section, together with the array of conductor end portions secured thereto, to a predetermined length prior to the fold-back step.

8. A method of separating at least two mutually disposed outer material layers from at least one separable inner material layer of a strip stock laminate of indefinite length, wherein the inner material layer has a significantly greater inherent resiliency than that of said outer material layers, said method comprising the steps of:

confining at least an end region of the laminate such that only an end portion thereof of predetermined length is exposed;

applying a first force against the major surface of one outer material layer end section, in a first direction, to effect a sharp, retainable bend, in at least the other outer material layer;

releasing the first force from the one outer material layer end section so as to allow at least the one inner material layer to snap back to at least approximately the original position thereof, as a result of the greater inherent resiliency thereof, thereby also forcing the one outer material layer end section to snap back to at least approximately the original position thereof;

applying a second force against the major surface of at least the one exposed inner material layer that was previously positioned adjacent the then bent-out other outer material layer, in a second direction, to effect a sharp, retainable bend, at a predetermined angle, in at least the one outer material layer end section, and releasing the second force from at least the one inner material layer so as to allow the latter to snap back to at least approximately the original position thereof, as a result of the greater inherent resiliency thereof, thus exposing the end sections of all of the separable material layers of the composite strip stock laminate so that subsequent work functions may be selectively performed thereon.

9. A method in accordance with claim 8 wherein said first and second forces result in the respective one and other outer material layer end sections being firmly biased, in sequence, against respectively aligned rigid backing surfaces.

10. A method in accordance with claim 9 wherein at least each of said outer material layer end sections are bent outwardly, in opposite directions, at an angle of approximately 90 degrees.

11. A method in accordance with claim 8 wherein said first and second forces are applied to said one outer material layer and to said inner material layer in the form of a biased wiping action imparted therealong.

12. A method in accordance with claim 10 further including the step of applying a force against each of said bent-out outer material layers, and in a direction to effect the sharp fold-back thereof against the adjacent portion of the associated outer material layer that remains a part of the composite strip stock laminate.

13. A method in accordance with claim 10 further including the step of trimming back each bent-out outer material layer end section to a predetermined length.

14. A method in accordance with claim 12 further including the step of trimming back each bent-out outer material layer end section to a predetermined length prior to the fold-back step.

15. An apparatus for forming the terminated end of a flat cable of indefinite length with fold-back portions so as to facilitate the subsequent connectorization thereof, wherein the cable is of the type having two overlying-/underlying arrays of laterally disposed conductors separated by a resilient insulative center film, with each array being secured directly to only the respectively adjacent one of two mutually disposed outer insulative films, and wherein the cable, as fabricated, further includes an aligned pair of resilient insulative isolating members respectively positioned on opposite sides of, and extending transversely across, the center film at each predetermined terminated end of the cable, said isolating members being of a material that will not adhere to the associated array of conductors and outer film, said apparatus including:

positioning means including upper and lower channel-forming means for confining and controllably transporting a cable back and forth between first and second work stations, while an exposed end section of such a confined cable, of predetermined length, extends beyond two laterally disposed face portions of said upper and lower channel-forming means at the upstream end thereof;

flare-out die means including a reciprocally driven die member located at said second work station, said die member having a laterally disposed cable end-receiving notch formed therein and a specially contoured outer cable wiping surface profile, said die member, in response to being reciprocally displaced in a direction perpendicular to the initial plane of an exposed end of a channel-confined cable, while being brought into periodic wiping contact therewith, cooperating with the forward face portions of said upper and lower channel-forming means to sequentially effect the bending of the two exposed end sections of the outer films, together with the coextensive arrays of conductor end portions respectively secured thereto, at sharp predetermined angles, and in different directions, relative to the initially coextensive center film end portion, and associated isolating members, which are also momentarily sequentially bent, in said different directions, but each time allowed to snap back to at least their approximate original positions, one time because of the presence of said die member notch, and reciprocally driven fold-back means located at said first work station for sharply folding back each previously outwardly bent outer film end section of a channel-confined cable, together with the array of exposed conductor end portions secured thereto, firmly against the adjacent portion of the outer film still remaining as part of the fabricated cable so as to facilitate the subsequent connectorization of the cable.

16. An apparatus in accordance with claim 15 further including:

trimming means, including a reciprocally driven die member located at said second work station, said die member having a spring-biased die insert confined within a central bore thereof, said die member and insert being adapted to cooperate with the face portions of said upper and lower channel-forming means to trim back each bent-out outer film end section of a channel-confined cable, together with the array of conductor end portions secured thereto, to a predetermined length prior to the actuation of said fold-back means.

17. An apparatus in accordance with claim 15 wherein said positioning means, flare-out means and fold-back means are all operated under respective, sequentially controlled pneumatic air cylinders.

18. An apparatus in accordance with claim 15 wherein said notch formed in said flare-out die member has a depth and width sufficient to receive any part of the exposed end section of a channel-confined cable, with said contoured outer cable wiping surface profile comprising a first beveled surface that extends from a lower wall of said notch to a second outer flat surface that is at least substantially perpendicular to the normal plane of a channel-confined cable, and which second flat surface merges into a third flat surface which is at least substantially perpendicular to the second flat surface, and separated by a relatively sharp corner of predetermined radius.

19. An apparatus in accordance with claim 18 wherein said flare-out die member effects the bending of said first and second outer film sections, together with the arrays of conductor end portions respectively secured thereto, approximately 90 degrees, in opposite directions, from their original common orientation.

20. An apparatus in accordance with claim 15 wherein said fold-back means includes a pair of rotatably mounted and retractably driven rollers that define a nip having a width sufficient to accommodate an exposed terminated end portion of the center film of a channel-confined cable, together with the two leading isolating tapes positioned thereon, said rollers upon being advanced from the free end backward along the last mentioned cable elements respectively effecting the sharp fold-back of different ones of the then bent-out outer film end sections, together with the respectively associated arrays of conductor end portions secured thereto.

21. An apparatus for forming the terminated end of a flat cable of indefinite length with fold-back portions so as to facilitate the subsequent connectorization thereof, wherein the cable is of the type having two overlying-/underlying arrays of laterally disposed conductors separated by a resilient insulative center film, with each array being secured directly to only the respectively adjacent one of two mutually disposed outer insulative films, and wherein the cable, as fabricated, further includes an aligned pair of resilient insulative isolating members respectively positioned on opposite sides of, and extending transversely across, the center film at each predetermined terminated end of the cable, said isolating members being of a material that will not adhere to the associated array of conductors and outer film, said apparatus including:

cross-slide means, including a reciprocally driven cross-slide, for confining and actuably clamping within a channel thereof an end region of a cable after the terminated end thereof has been advanced a predetermined distance beyond the forward end of said channel, and for transferring such a clamped cable in a controlled manner back and forth between first and second work stations;

guide block means positioned on the upstream side of said cross-slide channel, said guide block means including a cable-confining channel that is co-linear with said cross-slide channel, and extends laterally between said first and second work stations, said guide block means further having two mutually disposed forward face portions through which the terminated end of a cable is initially advanced, after having been first advanced through said cross-slide channel, so as to expose and end portion thereof, of predetermined length, prior to said cable being clamped in position by said cross-slide while positioned at said first work station;

flare-out means including a reciprocally driven die member located at said second work station, said die member including a specially configured cable end-receiving notch and a plurality of associated outer cable-bending surfaces, all of which cooperate with said face portions of said guide block means, in response to said die member being reciprocally displaced back and forth in a direction perpendicular to the initial plane of an exposed end portion of a clamped cable, and while being brought into periodic bending contact therewith, to sequentially effect: (1) the bending of the entire exposed end portion of the cable in a first direction, which results in one outer film end section, together with the coextensive array of conductor end portions secured thereto, being bent at a sharp, retainable and predetermined angle; (2) the release of the remaining part of the previously exposed end portion of a clamped cable, the remaining part snapping back to at least approximately the original orientation thereof, as a result of the inherent resiliency of at least said center film end portion; (3) the bending of such remaining part of the exposed cable end portion in a second direction, which results in the other outer film section, together with the coextensive array of conductor end portions secured thereto, being bent at a sharp, retainable and predetermined angle, and (4) the release and subsequent snap-back of the remaining exposed center film end portion, together with at least the coextensive portions of the isolating members positioned on opposite sides thereof, to their original common orientation, and reciprocally driven fold-back means located at said first work station for sharply folding back each previously bent-out outer film end section of a clamped cable, together with the array of the then exposed conductor end portions secured thereto, firmly against the adjacent portion of the outer film still remaining as part of the fabricated cable so as to facilitate the subsequent connectorization of the cable.

22. An apparatus in accordance with claim 21 further including:

trimming means, including a reciprocally driven die member located at said second work station, said die member having a spring-biased die insert, partially confined within a central channel thereof, said die insert having a cable end-receiving slot formed in a normally outwardly protruding forward end portion thereof, said die member and insert being adapted to cooperate with the face portions of said guide block means to trim back each bent-out outer film end section of a clamped cable, together with the array of conductor end portions secured thereto, to a predetermined length prior to the actuation of said fold-back means.

23. An apparatus in accordance with claim 22 wherein said fold-back means includes a pair of rotatably mounted and retractably driven rollers that define a nip having a width sufficient to accommodate an exposed terminated end portion of the center film of a clamped cable, together with the two leading isolating tapes positioned thereon, said rollers, upon being advanced from the free end backward along the last mentioned cable elements, respectively effecting the sharp fold-back of different ones of the then bent-out outer film end sections, together with the respectively associated arrays of conductor end portions secured thereto.

24. An apparatus in accordance with claim 22 wherein said notch formed in said flare-out die member has a depth and width sufficient to receive any part of the exposed end section of a channel-confined cable, with said contoured outer cable wiping surface profile comprising a first beveled surface that extends from a lower wall of said notch to a second outer flat surface that is at least substantially perpendicular to the normal plane of a channel-confined cable, and which second flat surface merges into a third flat surface which is at least substantially perpendicular to the second flat surface, and separated by a relatively sharp corner of predetermined radius.

25. An apparatus in accordance with claim 24 wherein said flare-out die member effects the bending of said first and second outer film sections, together with the arrays of conductor end portions respectively secured thereto, approximately 90 degrees, in opposite directions, from their original common orientation.

26. An apparatus in accordance with claim 21 further comprising pivotal cable stop means mounted on said guide block means and normally positioned to abut against the terminated end of a flat cable after having been advanced through said cross-slide and guide block means channel while the former is positioned at said first work station, said stop means thus controlling the length of the resultant exposed end portion of the cable prior to the latter being clamped within said cross-slide, and wherein said fold-back means further includes a retractable cam member positioned to bias said stop means away from the terminated end portion of said cable, after being partially formed by said flare-out means, in response to the advancement of said fold-back means into engagement with the latter.

* * * * *